United States Patent
Van Den Brink et al.

(10) Patent No.: US 6,897,653 B2
(45) Date of Patent: May 24, 2005

(54) MRI METHOD FOR CORRECTING AMPLITUDE OF RESONANCE SIGNALS

(75) Inventors: Johan Samuel Van Den Brink, Eindhoven (NL); Miha Fuderer, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/992,699

(22) Filed: Nov. 14, 2001

(65) Prior Publication Data

US 2002/0074998 A1 Jun. 20, 2002

(30) Foreign Application Priority Data

Nov. 14, 2000 (EP) .......................................... 00203991

(51) Int. Cl.⁷ ................................................. G01V 3/00
(52) U.S. Cl. ....................................... 324/307; 324/309
(58) Field of Search ............................... 324/307–309, 324/318, 322

(56) References Cited

U.S. PATENT DOCUMENTS

| | | | | |
|---|---|---|---|---|
| 4,625,171 A | | 11/1986 | Sekihara et al. | 324/312 |
| 4,672,320 A | * | 6/1987 | Sekihara et al. | 324/312 |
| 4,709,211 A | * | 11/1987 | Machida et al. | 324/309 |
| 4,761,612 A | * | 8/1988 | Holland et al. | 324/307 |
| 5,057,776 A | * | 10/1991 | Macovski | 324/309 |
| 5,122,748 A | * | 6/1992 | Oh et al. | 324/309 |
| 5,258,711 A | * | 11/1993 | Hardy | 324/309 |
| 5,332,969 A | * | 7/1994 | Tsuruno et al. | 324/309 |
| 5,446,384 A | * | 8/1995 | Dumoulin | 324/307 |
| 5,498,963 A | | 3/1996 | Schneider et al. | 324/309 |
| 5,672,969 A | * | 9/1997 | Zhou et al. | 324/309 |
| 6,078,176 A | * | 6/2000 | McKinnon | 324/309 |
| 6,150,815 A | * | 11/2000 | Janzen et al. | 324/309 |
| 6,157,192 A | * | 12/2000 | Cordes | 324/309 |
| 6,175,236 B1 | * | 1/2001 | Zhou et al. | 324/307 |
| 6,246,895 B1 | * | 6/2001 | Plewes | 600/410 |
| 6,249,694 B1 | * | 6/2001 | Foo et al. | 600/420 |
| 6,288,540 B1 | * | 9/2001 | Chen et al. | 324/300 |
| 6,313,629 B1 | * | 11/2001 | Liu et al. | 324/309 |
| 6,335,621 B1 | * | 1/2002 | Cho | 324/314 |
| 6,359,436 B1 | * | 3/2002 | Miyamoto et al. | 324/307 |
| 6,424,153 B1 | * | 7/2002 | Liu et al. | 324/309 |
| 6,466,017 B1 | * | 10/2002 | Ganin et al. | 324/318 |

FOREIGN PATENT DOCUMENTS

EP  0965855 A2  12/1999  ......... G01R/33/565

OTHER PUBLICATIONS

Callaghan et al., "Velocity and Diffusion Imaging in Dynamic NMR Microscopy," Journal Of Magnetic Resonance, Academic Press, London GB, vol. 91, 1991, pp. 326–352.

Patent Abstracts of Japan, Nishimura Hiroshi, "Magnetic Resonance Imaging Method," Publication No. 09173314, Aug. 7, 1997, Application No. 07350825, Dec. 26, 1995.

Hakansson et al., "The influence of a nonconstant magnetic–field gradient on PFG NMR diffusion experiments. A Brownian–dynamics computer simulation study,"

* cited by examiner

Primary Examiner—Diego Gutierrez
Assistant Examiner—Dixomara Vargas

(57) ABSTRACT

In a magnetic resonance imaging method flow quantities and diffusion quantities are measured in the presence of temporary magnetic gradient fields (gradient pulses). Signal amplitudes of the magnetic resonance signals and/or flow and diffusion quantities calculated from the magnetic resonance signals are corrected for non-linearities in the magnetic gradient fields.

18 Claims, 2 Drawing Sheets

MRI METHOD FOR CORRECTING AMPLITUDE OF RESONANCE SIGNALS

BACKGROUND OF THE INVENTION

1. Field of the Invention

The invention relates to a magnetic resonance imaging method wherein magnetic resonance signals are generated and temporary magnetic gradient fields are used.

A magnetic resonance imaging method of this kind is known from U.S. patent specification U.S. Pat. No. 5,498, 963.

2. Description of the Prior Art

The known magnetic resonance imaging method takes into account nonlinearities in the temporary magnetic gradient fields. The cited U.S. patent specification states that non-linearities in the temporary magnetic gradient fields give rise to distortions in the magnetic resonance image that is reconstructed from the magnetic resonance signals. In order to counteract such distortions, the phases or phase differences of the magnetic resonance signals are corrected. Even though the distortions in the magnetic resonance image are accurately corrected by means of the known magnetic resonance imaging method, it has been found that quantitative information cannot be accurately derived from the magnetic resonance signals.

SUMMARY OF THE INVENTION

It is an object of the invention to provide a magnetic resonance imaging method which enables accurate extraction of quantitative information from the magnetic resonance signals despite non-linearities in the temporary magnetic gradient fields. It is notably an object of the invention to provide a magnetic resonance imaging method that enables the execution of accurate diffusion, perfusion and/or flow measurements.

To this end, in conformity with the magnetic resonance imaging method in accordance with the invention the signal amplitudes of the magnetic resonance signals or quantities calculated from the signal amplitudes are corrected for deviations that are due to spatial non-linearities of the temporary magnetic gradient fields.

The non-linearities of the temporary magnetic gradient fields concern the spatial variations of these gradient fields. The term magnetic gradient field as used in the present context is to be understood to mean a magnetic field that has a spatial gradient in the magnetic field strength. The magnetic field strength of such an ideal magnetic gradient field is exactly linearly dependent on the position in one or more directions in space. For example, spatial encoding of the magnetic resonance signals is applied on the basis of a sequence of temporary magnetic gradient fields which are applied by one or more gradient coils. Ideally, in the case of an applied gradient field the magnetic field strength in one or more directions is linearly dependent on the spatial position in the relevant direction (directions). Inter alia because of limitations of the gradient coils whereby the gradient fields are generated, higher-order (for example, square and cubic) spatial dependencies of the magnetic field strength also arise. In accordance with the invention the signal amplitudes of the magnetic resonance signals are corrected instead of correcting exclusively the phases and phase differences of the magnetic resonance signals. It is thus achieved that the quantitative information that concerns the object to be examined and is contained in the signal amplitudes is accurately corrected in respect of disturbances that are due to the non-linearities of the temporary magnetic gradient fields. In addition to the correction of the signal amplitudes, it is also possible to correct the phases and phase differences of the magnetic resonance signals for the non-linearities of the temporary magnetic gradient fields. The accurately derived quantitative information in the magnetic resonance signals can thus be reproduced in a magnetic resonance image in which, moreover, distortions are avoided to a significant extent. In accordance with the invention it is also possible to correct quantities, such as flow quantities, diffusion quantities, perfusion quantities etc. that are calculated from the magnetic resonance signals, themselves for nonlinearities in the magnetic gradient fields. The correction of such quantities themselves is possible because the dependency of these quantities on the magnetic gradient fields is known. For example, the correction can be performed by using the actual local values of the gradient fields, that is, taking into account the non-linearities, for the calculation of the relevant quantity.

These and other aspects of the invention will be elaborated on the basis of the following embodiments which are defined in the dependent claims.

The correction for the non-linearities in accordance with the invention is preferably derived by calculating the instantaneous temporary magnetic fields from data relating to the control of the magnetic resonance imaging system. This data concerns notably the method of energizing of one or more gradient coils. The gradient coils generate the magnetic gradient fields in that an electric current is conducted through the gradient coils. In order to apply a temporary gradient field, also referred to as a gradient pulse, a temporary current pulse is conducted through the gradient coils. The actually produced magnetic gradient field, and hence the deviations from the ideal gradient, can be calculated from the geometrical shape of the gradient coils and the time profile of the electric current pulse. For example, the calculation can be based on Biot-Savart's law or on more complex versions thereof.

The magnetic resonance imaging method in accordance with the invention is particularly suitable for diffusion-weighted magnetic resonance imaging methods. For example, a bipolar gradient pair or a pair of gradients that have the same polarity and are separated by a refocusing pulse is then used to achieve the desired sensitivity of the magnetic resonance signals for diffusion in the patient to be examined. The effects involved in diffusion are small in comparison with, for example the free decay of nuclear spins or magnetic resonance echoes. Moreover, notably diffusion effects are highly dependent on the actually prevailing magnetic gradient field. Small deviations of the gradient field relative to the assumed exactly linear gradient field already give rise to comparatively large deviations of the value of the diffusion effect that is determined from the magnetic resonance signals. If no steps are taken, deviations, notably non-linearities in the temporary magnetic gradient fields relative to the assumed gradient field, will give rise to deviations of the measured diffusion effect. When the signal amplitudes, or the quantities calculated therefrom, that relate notably to diffusion, perfusion or flow, are corrected for non-linearities in the gradient fields in accordance with the invention, accurate values concerning diffusion in the patient to be examined can be derived from the magnetic resonance signals. In the diffusion-weighted magnetic resonance imaging method in accordance with the invention the diffusion sensitivity parameter, often referred to as the b parameter, is preferably corrected.

The magnetic resonance imaging method in accordance with the invention can also be advantageously used for perfusion magnetic resonance imaging methods that are intended to obtain accurate values concerning perfusion phenomena in the patient to be examined. The magnetic resonance imaging method in accordance with the invention can also be advantageously used for flow-sensitive magnetic resonance imaging methods. In that case preferably the flow sensitivity, often referred to as the Q flow, is corrected in accordance with the invention. Values concerning the flow of blood and/or other body fluids, such as CSF, can thus be accurately derived from the magnetic resonance signals.

The invention also relates to a computer program. The computer program in accordance with the invention comprises instructions for generating magnetic resonance signals, for applying temporary magnetic gradient fields and for correcting the signal amplitudes of the magnetic resonance signals for deviations that are due to spatial nonlinearities of the temporary magnetic gradient fields. The magnetic resonance imaging system includes a computer which is suitable for carrying out the various functions of the magnetic resonance imaging system. When such a computer program in accordance with the invention is loaded into the computer of the magnetic resonance imaging system, the method in accordance with the invention can be executed by means of such a magnetic resonance imaging system. For example, the computer program can be loaded into the working memory of the magnetic resonance imaging system from a carrier, such as a CD-ROM disc, but it is also possible to download the computer program in accordance with the invention via a network such as the worldwide web.

BRIEF DESCRIPTION OF THE DRAWINGS

These and other aspects of the invention will be described in detail hereinafter, by way of example, with reference to the following embodiments and the accompanying drawing; therein.

DETAILED DESCRIPTION OF THE PREFERRED EMBODIMENTS

Figure 1:
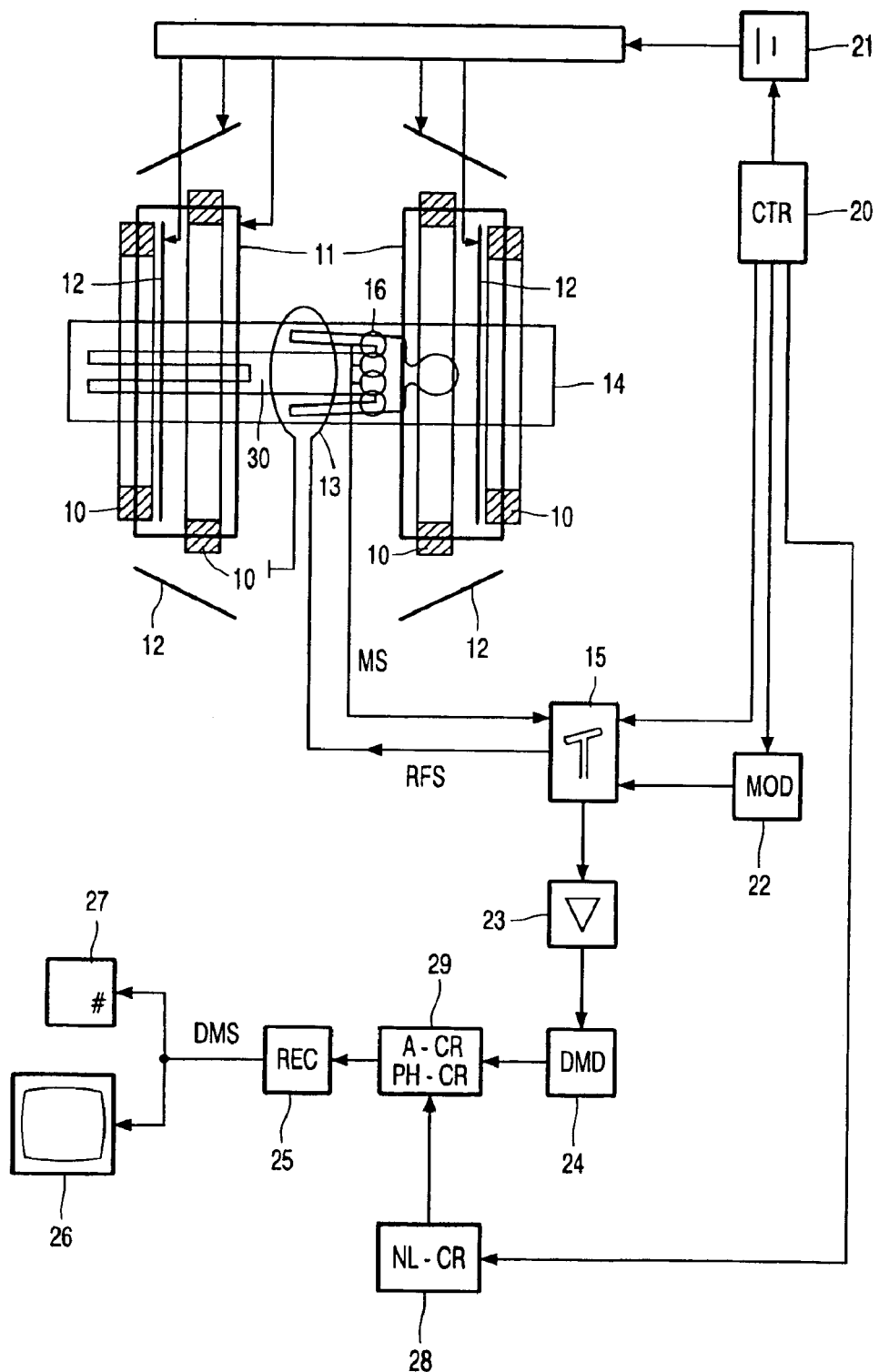
FIG. 1 shows diagrammatically a magnetic resonance imaging system in which the invention is used.

FIG. 1 shows diagrammatically a magnetic resonance imaging system in which the invention is used. The magnetic resonance imaging system includes a system of main coils 10 whereby the steady, uniform magnetic field is generated. The main coils are constructed, for example, in such a manner that they enclose a tunnel-shaped examination zone. The patient to be examined is introduced into said tunnel-shaped examination zone. The magnetic resonance imaging system also includes a number of gradient coils 11, 12 whereby magnetic fields with spatial variations, notably in the form of temporary gradients in separate directions, are superposed on the uniform magnetic field. The gradient coils 11, 12 are connected to a variable power supply unit 21. The gradient coils 11, 12 are energized by applying a current thereto by means of the power supply unit 21. The strength, the direction and the duration of the gradients are controlled by control of the power supply unit. The magnetic resonance imaging system also includes transmission and receiving coils 13, 15 for generating the RF excitation pulses and for collecting the magnetic resonance signals, respectively. The RF excitation pulses excite (nuclear) spins in the object to be examined (or the patient to be examined) present in the steady magnetic field. Subsequently, relaxation of the excited (nuclear) spins occurs with the result that magnetic resonance signals are emitted. The magnetic resonance signals may be free induction decay (FID) signals, but it is also possible to generate magnetic resonance echoes. It is notably possible to generate spin echo signals when use is made of refocusing RF pulses. It is also possible to generate gradient echo signals by application of temporary gradient fields. Application of the temporary gradient fields provides spatial encoding of the magnetic resonance signals. The transmission coil 13 is preferably constructed as a body coil 13 that can enclose (a part of) the object to be examined. The body coil is usually arranged in the magnetic resonance imaging system in such a manner that the patient 30 to be examined is situated within the body coil 13 when he or she is positioned in the magnetic resonance imaging system. The body coil 13 acts as a transmission antenna for transmitting the RF excitation pulses and RF refocusing pulses. The body coil 13 preferably provides a spatially uniform intensity distribution of the transmitted RF pulses. Usually the same coil or antenna is used alternately as a transmission coil and as a receiving coil. Furthermore, the transmission and receiving coil is usually configured as a coil, but other geometries where the transmission and receiving coil acts as a transmission and receiving antenna for RF electromagnetic signals are also feasible. The transmission and receiving coil 13 is connected to an electronic transceiver circuit 15.

However, it is to be noted that it is also possible to use separate receiving coils. For example, surface coils can then be used as receiving coils. Such surface coils have a high sensitivity in a comparatively small volume. The transmission coils, such as the surface coils, are connected to a demodulator 24 and the magnetic resonance signals (RFS) received are demodulated by means of the demodulator 24. The demodulated magnetic resonance signals (DMS) are applied to a reconstruction unit. The receiving coil is connected to a pre-amplifier 23. The pre-amplifier 23 amplifies the RF resonance signal (RFS) received by the receiving coil and the amplified RF resonance signal is applied to a demodulator 24. The demodulator 24 demodulates the amplified RF resonance signal. The demodulated resonance signal contains the actual information concerning the local spin densities in the part of the object to be imaged. Furthermore, the transceiver circuit 15 is connected to a modulator 22. The modulator 22 and the transceiver circuit 15 activate the transmission coil 13 so as to transmit the RF excitation and refocusing pulses. The reconstruction unit derives one or more image signals from the demodulated magnetic resonance signals (DMS); such image signals represent the image information of the imaged part of the object to be examined. In practice the reconstruction unit 25 is preferably constructed as a digital image processing unit 25 which is programmed to derive from the demodulated magnetic resonance signals the image signals that represent the image information of the part of the object that is to be imaged. The signal at the output of the reconstruction unit is applied to a monitor 26 so that the three-dimensional density distribution or the spectroscopic information can be displayed on the monitor. It is alternatively possible to store the signal from the reconstruction unit in a buffer unit 27 while awaiting further processing.

The correction of the magnetic resonance signals, notably the signal amplitudes but also the phases and phase differences, for non-linearities of the gradient fields is performed by a correction unit 29. An analysis unit 28 calculates the non-linearity corrections that are necessary for the correction from the method of activation of the gradient coils and the transmission and receiving coils. To this end, the analysis unit 28 is coupled to the control unit 20 so as to obtain the necessary data concerning the activation of the various coils. The analysis unit 28 and the correction unit 29 and the reconstruction unit are preferably implemented as software in a contemporary magnetic resonance imaging system.

Figure 2:
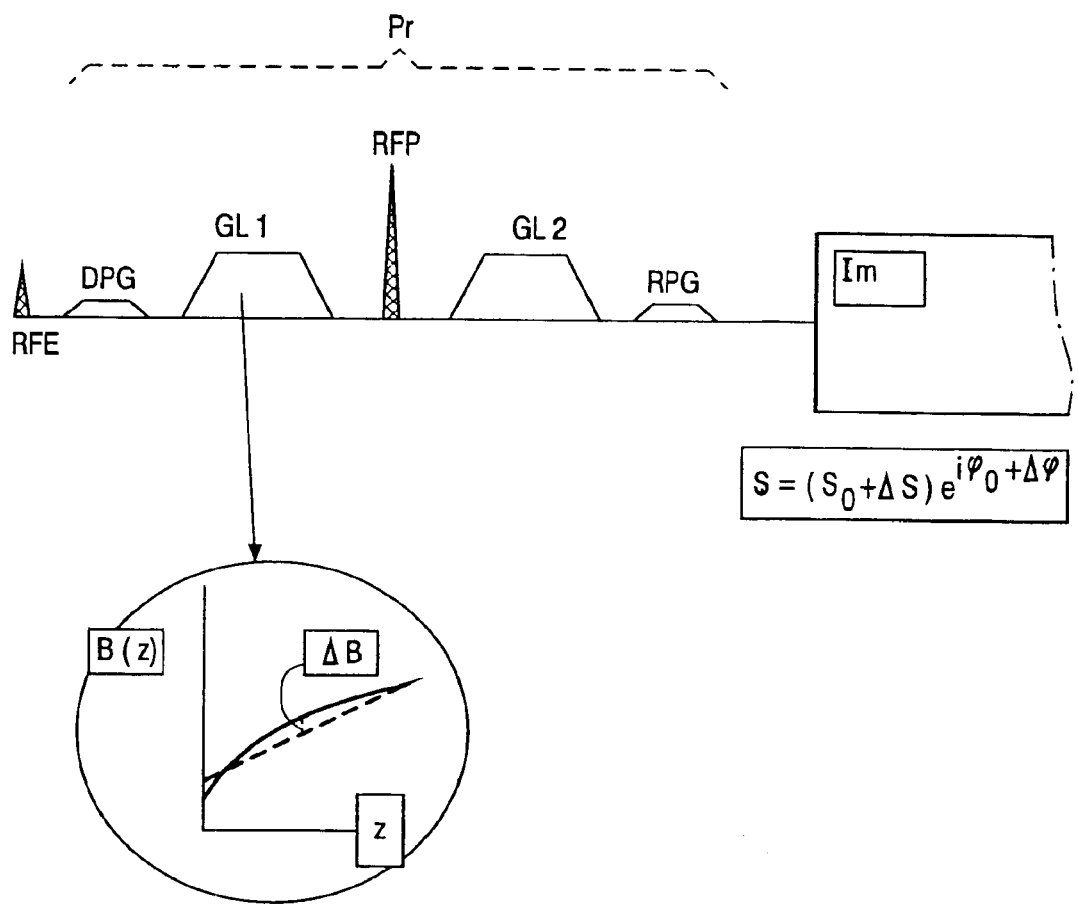
FIG. 2 illustrates the invention for a diffusion-sensitive magnetic pulse sequence.

FIG. 2 illustrates the invention for a diffusion-sensitive magnetic pulse sequence. FIG. 2 shows a magnetic pulse sequence whereby diffusion-sensitive magnetic resonance signals are generated. The pulse sequence includes a preparation section (Pr) that provides the diffusion sensitivity, which section is succeeded by an imaging section (Im). The imaging section preferably concerns a fast magnetic resonance pulse sequence such as EPI or TFE. Methods wherein the k space is sampled radially or along a spiral-shaped trajectory can also be advantageously used. The spins in the steady magnetic field are excited by means of a 90° RF excitation pulse (RFE). Furthermore, the sequence contains two gradient lobes or gradient pulses (GL1 and GL2) wherebetween a 180° refocusing pulse (RFP) is applied. A dephasing gradient and a rephasing gradient are also applied. The magnetic fields B(z) through, for example such a gradient lobe GL1 deviate from exact linearity in dependence on, for example the position on the z axis. The deviation AB of the linearly increasing magnetic field strength is shown in the insert in FIG. 2. The magnetic resonance signals S produced exhibit a deviation in respect of the signal amplitude ΔS and a phase deviation Δϕ relative to the signal amplitude and phase in the case of an exactly linearly increasing magnetic field strength. For these deviations, notably for the deviation ΔS, the correction unit 29 performs corrections such that correct diffusion values are reproduced in the magnetic resonance image.

What is claimed is:

1. A magnetic resonance imaging method comprising the steps of:

a.) generating magnetic resonance signals, having signal amplitudes and phases, by:
   i.) producing a uniform magnetic field, utilizing a main coil system comprising a plurality of main coils to produce said uniform magnetic field;
   ii.) generating RF excitation pulses, utilizing a transmission coil to generate said RF excitation pulses, such that said RF excitation pulses excite nuclear spins in an object that is to be imaged, which is residing within said uniform magnetic field;
   iii.) terminating said RF excitation pulses to relax said nuclear spins and thereby emit magnetic resonance signals;
b.) generating temporary magnetic gradient fields, utilizing a plurality of gradient coils, by applying a temporary gradient pulse to said gradient coils to generate said temporary magnetic gradient fields;
c.) superposing said temporary magnetic gradient fields on said uniform magnetic field to provide spatial encoding of the magnetic resonance signals being emitted;
d.) receiving said spatially encoded magnetic resonance signals, utilizing a receiving coil;
e.) correcting said signal amplitudes of said spatially encoded magnetic resonance signals, or quantities calculated from said spatially encoded signal amplitudes for deviations based on spatial non-linearities in the magnetic field strength of said temporary magnetic gradient fields, utilizing correction means, to produce corrected magnetic resonance signals, said step of correcting including calculating deviations of actual magnetic gradient field from an ideal gradient field using the geometrical shape of the gradient coils and the time profile of the temporary current pulse through the gradient coils; and
f.) outputting said corrected magnetic resonance signals, utilizing output means, to form a magnetic resonance image.

2. The magnetic resonance imaging method according to claim 1, wherein said magnetic resonance signals are diffusion-weighted.

3. The magnetic resonance imaging method according to claim 2, wherein the magnetic resonance imaging method is diffusion-related and a diffusion sensitivity parameter (b) is a quantity calculated from said amplitudes of said magnetic resonance signals, which is corrected for deviations based on spatial non-linearities of the temporary magnetic gradient fields.

4. The magnetic resonance imaging method according to claim 1, wherein the magnetic resonance imaging method is flow-related and a flow sensitivity parameter (Q) is a quantity calculated from said amplitudes of said magnetic resonance signals, which is corrected for deviations based on spatial non-linearities of the temporary magnetic gradient fields.

5. A The magnetic resonance imaging method comprising the steps of:

a.) generating magnetic resonance signals, having signal amplitudes and phases, by:
   i.) producing a uniform magnetic field, utilizing a main coil system comprising a plurality of main coils to produce said uniform magnetic field;
   ii.) generating RF excitation pulses, utilizing a transmission coil to generate said RF excitation pulses, such that said RF excitation pulses excite nuclear spins in an object that is to be imaged, which is residing within said uniform magnetic field;
   iii.) terminating said RF excitation pulses to relax said nuclear spins and thereby emit magnetic resonance signals;
b.) generating temporary magnetic gradient fields, utilizing a plurality of gradient coils to generate said temporary magnetic gradient fields, wherein said uniform magnetic field, said temporary magnetic gradient fields and said RF excitation pulses comprise part of a pulse sequence including a preparation section and an imaging section, and said temporary magnetic gradient fields include a bipolar gradient pair in the preparation section;
c.) superposing said temporary magnetic gradient fields on said uniform magnetic field to provide spatial encoding of the magnetic resonance signals being emitted;
d.) receiving said spatially encoded magnetic resonance signals, utilizing a receiving coil;
e.) correcting said signal amplitudes of said spatially encoded magnetic resonance signals, or quantities calculated from said spatially encoded signal amplitudes for deviations based on spatial non-linearities in the magnetic field strength of said temporary magnetic gradient fields, utilizing correction means, to produce corrected magnetic resonance signals; and
f.) outputting said corrected magnetic resonance signals, utilizing output means, to form a magnetic resonance image.

6. The magnetic resonance imaging method according to claim 5, wherein said step of generating temporary magnetic gradient fields includes applying a temporary current pulse to said gradient coils, and said step of correcting the signal amplitudes of the magnetic resonance signals includes calculating deviations of actual magnetic gradient field from an ideal gradient field using the geometrical shape of the gradient coils and the time profile of the temporary current pulse through the gradient coils.

7. A The magnetic resonance imaging method comprising the steps of:
   a.) generating magnetic resonance signals, having signal amplitudes and phases, by:
      i.) producing a uniform magnetic field, utilizing a main coil system comprising a plurality of main coils to produce said uniform magnetic field;
      ii.) generating RF excitation pulses, utilizing a transmission coil to generate said RF excitation pulses, such that said RF excitation pulses excite nuclear spins in an object that is to be imaged, which is residing within said uniform magnetic field;
      iii.) terminating said RF excitation pulses to relax said nuclear spins and thereby emit magnetic resonance signals;
   b.) generating temporary magnetic gradient fields, utilizing a plurality of gradient coils to generate said temporary magnetic gradient fields, wherein said uniform magnetic field, said temporary magnetic gradient fields and said RF excitation pulses comprise part of a pulse sequence including a preparation section and an imaging section, and said temporary gradient fields include a pair of gradient pulses that have the same polarity and are separated by a refocusing pulse in the preparation section;
   c.) superposing said temporary magnetic gradient fields on said uniform magnetic field to provide spatial encoding of the magnetic resonance signals being emitted;
   d.) receiving said spatially encoded magnetic resonance signals, utilizing a receiving coil;
   e.) correcting said signal amplitudes of said spatially encoded magnetic resonance signals, or quantities calculated from said spatially encoded signal amplitudes for deviations based on spatial non-linearities in the magnetic field strength of said temporary magnetic gradient fields, utilizing correction means, to produce corrected magnetic resonance signals; and
   f.) outputting said corrected magnetic resonance signals, utilizing output means, to form a magnetic resonance image.

8. The magnetic resonance imaging method according to claim 7, wherein said step of generating temporary magnetic gradient fields includes applying a temporary current pulse to said gradient coils, and said step of correcting the signal amplitudes of the magnetic resonance signals includes calculating deviations of actual magnetic gradient field from an ideal gradient field using the geometrical shape of the gradient coils and the time profile of the temporary current pulse through the gradient coils.

9. A magnetic resonance imaging system comprising:
   a.) means for generating magnetic resonance signals, having signal amplitudes and phases, said means including:
      i.) means for producing a uniform magnetic field, and
      ii.) means for alternatively generating and terminating RF excitation pulses to excite nuclear spins in an object being imaged, residing within said uniform magnetic field, thereby causing the emission of magnetic resonance signals;
   b.) means for generating temporary magnetic gradient fields and superposing them on said uniform magnetic field to spatially encode said magnetic resonance signals being emitted, thereby producing spatially encoded magnetic resonance signals, said means for generating temporary magnetic gradient fields comprising means for applying a temporary gradient pulse to said gradient coils to generate said temporary magnetic gradient fields;
   c.) means for receiving said spatially encoded magnetic resonance signals;
   d.) means for correcting said signal amplitudes of said magnetic resonance signals, or quantities calculated from said signal amplitudes, for deviations based on spatial non-linearities in the magnetic field strength of said temporary magnetic gradient fields, to produce corrected magnetic resonance signals, said means for correcting comprising means for calculating deviations of actual magnetic gradient field from an ideal gradient field using the geometrical shape of the gradient coils and the time profile of the temporary current pulse through the gradient coils; and
   e.) means for outputting said corrected magnetic resonance signals and forming a magnetic resonance image therefrom.

10. A computer-readable medium storing a computer program with computer executable instructions for performing the steps of:
   a.) generating magnetic resonance signals in a magnetic resonance imaging system, said magnetic resonance signals having signal amplitudes and phases, by:
      i.) producing a uniform magnetic field, utilizing a main coil system comprising a plurality of main coils to produce said uniform magnetic field;
      ii.) generating RF excitation pulses, utilizing a transmission coil to generate said RF excitation pulses, such that said RF excitation pulses excite nuclear spins in an object that is to be imaged, which is residing within said uniform magnetic field;
      iii.) terminating said RF excitation pulses to relax said nuclear spins and thereby emit magnetic resonance signals;
   b.) generating temporary magnetic gradient fields in said magnetic resonance system, utilizing a plurality of gradient coils, by applying a temporary gradient pulse to said gradient coils to generate said temporary magnetic gradient fields;
   c.) superposing said temporary magnetic gradient fields on said uniform magnetic field to provide spatial encoding of the magnetic resonance signals being emitted;
   d.) receiving said spatially encoded magnetic resonance signals, utilizing a receiving coil;
   e.) correcting said signal amplitudes of said spatially encoded magnetic resonance signals, or quantities calculated from said spatially encoded signal amplitudes for deviations based on spatial non-linearities in the magnetic field strength of said temporary magnetic gradient fields, utilizing correction means, to produce corrected magnetic resonance signals, said step of correcting including calculating deviations of actual magnetic gradient field from an ideal gradient field using the geometrical shape of the gradient coils and the time profile of the temporary current pulse through the gradient coils; and f.) outputting said corrected magnetic resonance signals, utilizing output means, to form a magnetic resonance image.

11. A magnetic resonance imaging system comprising;
a.) means for generating diffusion-weighted magnetic resonance signals, having signal amplitudes and phases, said means including:
  i.) means for producing a uniform magnetic field, and
  ii.) means for alternatively generating and terminating RF excitation pulses to excite nuclear spins in an object being imaged, residing within said uniform magnetic field, thereby causing the emission of magnetic resonance signals;
b.) means for generating temporary magnetic gradient fields and superposing them on said uniform magnetic field to spatially encode said magnetic resonance signals being emitted, thereby producing spatially encoded magnetic resonance signals, wherein said uniform magnetic field, said temporary magnetic gradient fields and said RF excitation pulses comprise part of a pulse sequence including a preparation section and an imaging section, and said temporary magnetic gradient fields include a bipolar gradient pair in the preparation section;
c.) means for receiving said spatially encoded magnetic resonance signals;
d.) means for correcting said signal amplitudes of said magnetic resonance signals, or quantities calculated from said signal amplitudes, for deviations based on spatial non-linearities in the magnetic field strength of said temporary magnetic gradient fields, to produce corrected magnetic resonance signals; and
e.) means for outputting said corrected magnetic resonance signals and forming a magnetic resonance image therefrom.

12. A magnetic resonance imaging system according to claim 11, wherein said means for generating temporary magnetic gradient fields includes means for applying a temporary current pulse to said gradient coils, and said means for correcting the signal amplitudes of the magnetic resonance signals includes means for calculating deviations of actual magnetic gradient field from an ideal gradient field using the geometrical shape of said gradient coils and the time profile of the temporary current pulse through said gradient coils.

13. A magnetic resonance imaging system comprising:
a.) means for generating diffusion-weighted magnetic resonance signals, having signal amplitudes and phases, said means including:
  i.) means for producing a uniform magnetic field, and
  ii.) means for alternatively generating and terminating RF excitation pulses to excite nuclear spins in an object being imaged, residing within said uniform magnetic field, thereby causing the emission of magnetic resonance signals;
b.) means for generating temporary magnetic gradient fields and superposing them on said uniform magnetic field to spatially encode said magnetic resonance signals being emitted, thereby producing spatially encoded magnetic resonance signals, wherein said uniform magnetic field, said temporary magnetic gradient fields and said RF excitation pulses comprise part of a pulse sequence including a preparation section and an imaging section, and said temporary gradient fields include a pair of gradient pulses that have the same polarity and are separated by a refocusing pulse in the preparation section;
c.) means for receiving said spatially encoded magnetic resonance signals;
d.) means for correcting said signal amplitudes of said magnetic resonance signals, or quantities calculated from said signal amplitudes, for deviations based on spatial non-linearities in the magnetic field strength of said temporary magnetic gradient fields, to produce corrected magnetic resonance signals; and
e.) means for outputting said corrected magnetic resonance signals and forming a magnetic resonance image therefrom.

14. The magnetic resonance imaging system according to claim 13, wherein said means for generating temporary magnetic gradient fields includes means for applying a temporary current pulse to said gradient coils, and said means for correcting the signal amplitudes of the magnetic resonance signals includes means for calculating deviations of actual magnetic gradient field from an ideal gradient field using the geometrical shape of said gradient coils and the time profile of the temporary current pulse through said gradient coils.

15. A computer-readable medium storing a computer program with computer executable instructions for performing the steps of:
a.) generating diffusion-weighted magnetic resonance signals in a magnetic resonance imaging system, said magnetic resonance signals having signal amplitudes and phases, by:
  i.) producing a uniform magnetic field, utilizing a main coil system comprising a plurality of main coils to produce said uniform magnetic field;
  ii.) generating RF excitation pulses, utilizing a transmission coil to generate said RF excitation pulses, such that said RF excitation pulses excite nuclear spins in an object that is to be imaged, which is residing within said uniform magnetic field;
  iii.) terminating said RF excitation pulses to relax said nuclear spins and thereby emit magnetic resonance signals;
b.) generating temporary magnetic gradient fields in said magnetic resonance system, utilizing a plurality of gradient coils to generate said temporary magnetic gradient fields, wherein said uniform magnetic field, said temporary magnetic gradient fields and said RF excitation pulses comprise part of a pulse sequence including a preparation section and an imaging section, and said temporary magnetic gradient fields include a bipolar gradient pair in the preparation section;
c.) superposing said temporary magnetic gradient fields on said uniform magnetic field to provide spatial encoding of the magnetic resonance signals being emitted;
d.) receiving said spatially encoded magnetic resonance signals, utilizing a receiving coil;
e.) correcting said signal amplitudes of said spatially encoded magnetic resonance signals, or quantities calculated from said spatially encoded signal amplitudes for deviations based on spatial non-linearities in the magnetic field strength of said temporary magnetic gradient fields, utilizing correction means, to produce corrected magnetic resonance signals; and
f.) outputting said corrected magnetic resonance signals, utilizing output means, to form a magnetic resonance image.

16. The computer-readable medium according to claim 15, wherein said step of generating temporary magnetic gradient fields includes applying a temporary current pulse to said gradient coils, and said step of correcting the signal amplitudes of the magnetic resonance signals includes calculating deviations of actual magnetic gradient field from an ideal gradient field using the geometrical shape of the gradient coils and the time profile of the temporary current pulse through the gradient coils.

17. A computer-readable medium storing a computer program with computer executable instructions for performing the steps of:
- a.) generating diffusion-weighted magnetic resonance signals in a magnetic resonance imaging system, said magnetic resonance signals having signal amplitudes and phases, by:
  - i.) producing a uniform magnetic field, utilizing a main coil system comprising a plurality of main coils to produce said uniform magnetic field;
  - ii.) generating RF excitation pulses, utilizing a transmission coil to generate said RF excitation pulses, such that said RF excitation pulses excite nuclear spins in an object that is to be imaged, which is residing within said uniform magnetic field;
  - iii.) terminating said RF excitation pulses to relax said nuclear spins and thereby emit magnetic resonance signals;
- b.) generating temporary magnetic gradient fields in said magnetic resonance system, utilizing a plurality of gradient coils to generate said temporary magnetic gradient fields, wherein said uniform magnetic field, said temporary magnetic gradient fields and said RF excitation pulses comprise part of a pulse sequence including a preparation section and an imaging section, and said temporary gradient fields include a pair of gradient pulses that have the same polarity and are separated by a refocusing pulse in the preparation section;
- c.) superposing said temporary magnetic gradient fields on said uniform magnetic field to provide spatial encoding of the magnetic resonance signals being emitted;
- d.) receiving said spatially encoded magnetic resonance signals, utilizing a receiving coil;
- e.) correcting said signal amplitudes of said spatially encoded magnetic resonance signals, or quantities calculated from said spatially encoded signal amplitudes for deviations based on spatial non-linearities in the magnetic field strength of said temporary magnetic gradient fields, utilizing correction means, to produce corrected magnetic resonance signals; and
- f.) outputting said corrected magnetic resonance signals, utilizing output means, to form a magnetic resonance image.

18. The computer-readable medium according to claim 17, wherein said step of generating temporary magnetic gradient fields includes applying a temporary current pulse to said gradient coils, and said step of correcting the signal amplitudes of the magnetic resonance signals includes calculating deviations of actual magnetic gradient field from an ideal gradient field using the geometrical shape of the gradient coils and the time profile of the temporary current pulse through the gradient coils.

* * * * *